(12) United States Patent
Bock et al.

(10) Patent No.: US 7,180,396 B2
(45) Date of Patent: Feb. 20, 2007

(54) SUPERCONDUCTING CURRENT LIMITING DEVICE WITH MAGNETIC FIELD ASSISTED QUENCHING

(75) Inventors: Joachim Bock, Erfstadt (DE); Steffen Elschner, Heidelberg (DE); Frank Breuer, Bonn (DE)

(73) Assignee: Nexans, Paris (FR)

( * ) Notice: Subject to any disclaimer, the term of this patent is extended or adjusted under 35 U.S.C. 154(b) by 0 days.

(21) Appl. No.: 10/962,208

(22) Filed: Oct. 8, 2004

(65) Prior Publication Data

US 2005/0099253 A1 May 12, 2005

(30) Foreign Application Priority Data

Oct. 15, 2003 (EP) .................................. 03023353

(51) Int. Cl.
*H01F 27/00* (2006.01)
(52) U.S. Cl. ........................................ 336/100; 335/216
(58) Field of Classification Search ................. 361/19; 29/599; 505/490; 338/32 S; 336/100; 335/216
See application file for complete search history.

(56) References Cited

U.S. PATENT DOCUMENTS

| RE25,712 | E | * | 1/1965 | Slade | ........................ 336/155 |
| 5,694,279 | A | * | 12/1997 | Mumford | ...................... 361/19 |
| 5,986,536 | A | * | 11/1999 | Ries et al. | ....................... 338/13 |
| 6,043,731 | A | * | 3/2000 | McDougall et al. | ...... 338/32 S |
| 6,081,987 | A | * | 7/2000 | Kalsi et al. | .................... 29/599 |
| 6,177,856 | B1 | * | 1/2001 | Chen et al. | .................... 338/13 |
| 2003/0021074 | A1 | * | 1/2003 | Yuan et al. | .................. 361/117 |
| 2004/0116302 | A1 | * | 6/2004 | Gauss et al. | ................. 505/490 |
| 2004/0264072 | A1 | * | 12/2004 | Yuan | ........................... 361/19 |

FOREIGN PATENT DOCUMENTS

| FR | 2691591 | 5/1992 |
| GB | 2332558 | 6/1999 |
| JP | 026326 | 1/1989 |

OTHER PUBLICATIONS

European Search Report dated Mar. 17, 2004.
Institute of Electronic Engineers No. 7621304 for "Superconducting Fault Current Limiter With Bulk" dated Oct. 1, 2002.
Institute of Electronic Engineers No. 4466584 for: "Large Shaped Parts of Melt Cast BSCCO for Applications in Electrical Engineering" dated Mar. 1993.
Institute of Electronic Engineers No. 7706654 for: "Microstructural and Electrical Characterization of gas Cluster ion Beam-Smoothed YBCO Films" dated Jun. 2003.

* cited by examiner

*Primary Examiner*—Elvin Enad
(74) *Attorney, Agent, or Firm*—Sofer & Haroun, LLP

(57) ABSTRACT

The present invention relates to a superconducting current limiting device comprising a superconductor component (1) wherein each superconductor component (1) comprises a superconductor body (2) on which a coil (3) is wound the coil being electrically connected to the superconductor body (2) wherein in the superconducting current limiting device a magnetic field is generated on transition of the superconductor from the superconducting state to the normal conducting state.

17 Claims, 2 Drawing Sheets

Figure 5:
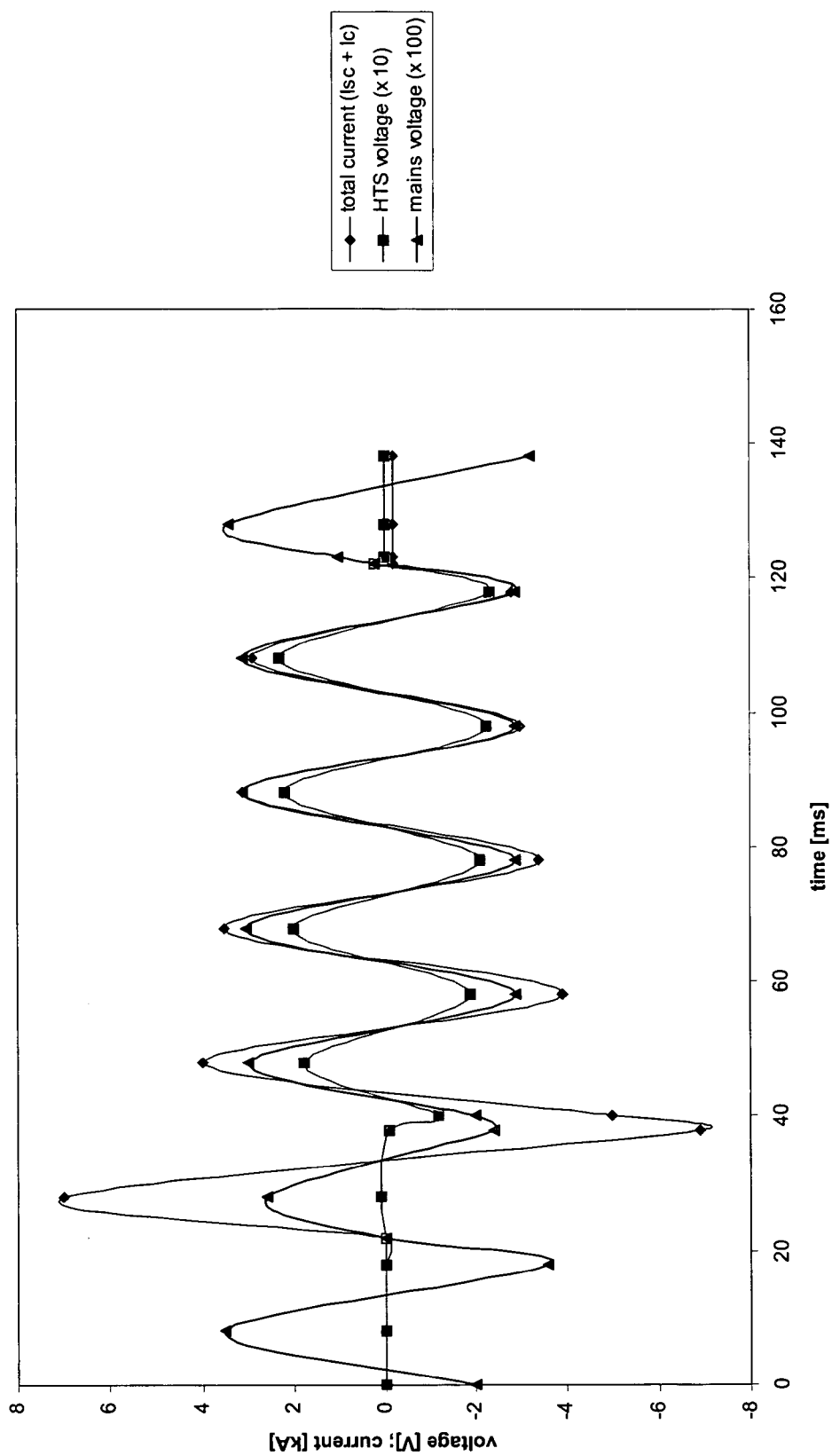

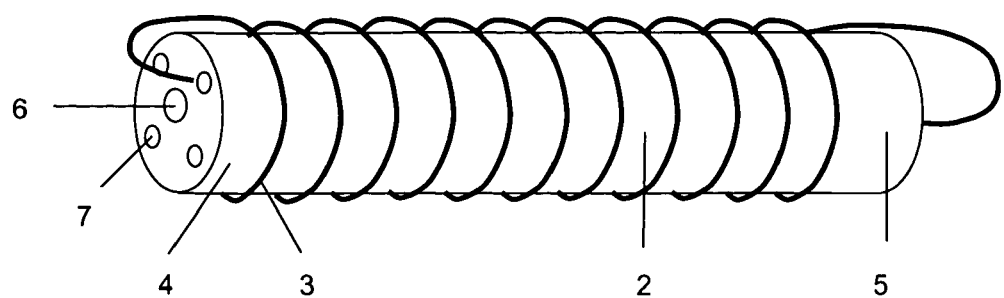
Fig. 1
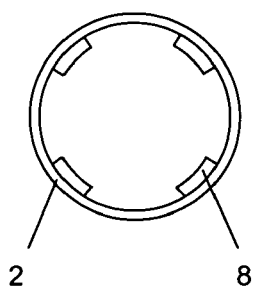 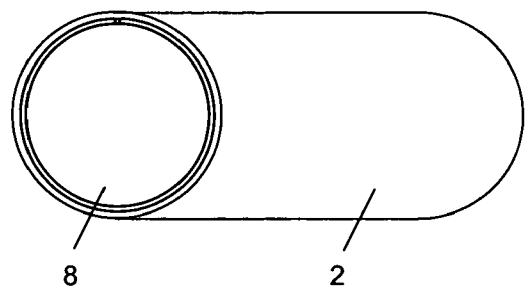
Fig. 2a  Fig. 2b
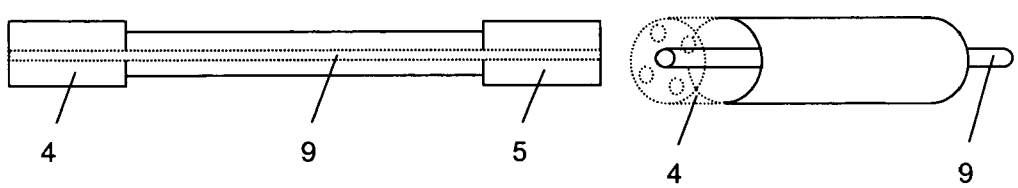
Fig. 3a  Fig. 3b
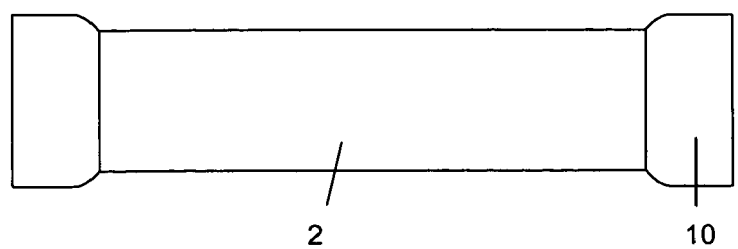
Fig. 4

SUPERCONDUCTING CURRENT LIMITING DEVICE WITH MAGNETIC FIELD ASSISTED QUENCHING

RELATED APPLICATION

This application is based on and claims the benefit of priority from European Patent Application No. 03 023 353.0, filed on Oct. 15, 2003, the entirety of which is incorporated herein by reference.

The present invention relates to a superconducting current limiting device. In particular, the present invention relates to an inductive superconducting current limiting device generating a magnetic field on transition of the superconductor from a superconducting state to the normal conducting state.

Current limiters are useful for modern power systems, in particular high power systems, in order to avoid unacceptable large current surges due to any fault such as short circuits etc. and, thus, protect the power systems from damage.

Superconductors offer a great potential as fault current limiters which enable rapid and effective current limitation, automatic recovery, negligible impedance during normal operation and application at high voltage.

All superconductor materials can loose their superconductor properties by
  a) exceeding the critical temperature (Tc),
  b) exceeding the critical magnetic field (Hc), or
  c) exceeding the critical current (Ic),
  d) or by 2 or more of that events at the same time.

The critical current or critical current density, critical temperature and critical magnetic field are specific for a specific superconductor material.

In case of fault the current flowing through the superconductor exceeds the critical current of the superconductor material due to large surge current and the superconductor material passes from the superconducting state to the normal conducting state. This transition from the superconducting state to the normal conducting state is called "quenching". After the current limiting event the superconductor returns to its superconducting state for further operation. For good further operation it is necessary, that the superconductor is not damaged on transition due to local heating or burn out during quench. The reason for such damage is non uniform quenching of the superconductor. The regions of such non uniformity are called hot spots.

In practical, the superconductor material of which a superconductor body is made is not completely homogeneous throughout the superconductor body, so that the above properties such as the critical current density can be different at different regions of the superconductor body. Consequently, in case of fault current some regions become already resistive whereas other regions still remain superconducting. Due to the still superconducting regions high current flow through the superconductor body leading to a high temperature increase in the already resistive regions and causing burn our in these regions as set out above. Thus, in order to avoid damage of the superconductor body during quenching it is necessary that the quenching occurs as homogeneously and rapidly as possible so that the superconductor body becomes resistive as a whole within a time sufficiently short to avoid burn out.

In order to assist quenching it is known to apply a external magnetic field to the superconductor body of a superconducting current limiting device. By said magnetic field the critical current density of the superconductor material is reduced which, in turn, promotes quenching.

In U.S. Pat. No. 6,043,731 a superconducting current limiting device is disclosed wherein magnetic field generating means are provided for generating and applying, during normal operation in the superconducting state, a magnetic field to the superconductor in order to hold the current density below the critical current density. In the fault event the magnetic field is adjusted to reduce the critical current density in order to bring the superconductor to a resistive state. After the fault event by increasing the critical current density the superconductor is returned to its superconducting state.

According to an embodiment the superconductor is positioned within a shunt coil which is connected in parallel to the superconductor. In fault event excess current is forced into the shunt coil and the current flow in the shunt coil generates a magnetic field which acts on the superconductor and decreases the critical current density, thereby assisting quenching.

As superconductor a thin film superconductor is disclosed on a semi conducting substrate. According to the figure layers of superconductor thin films and layers of the substrate alternate, that is the superconductor is a stack of layers of superconductor thin films and layers of substrates. However, further details as to the specific constructions of this embodiment, in particular of the resulting shape of the superconductor, are not given.

In U.S. publication 2003/0021074 A1, Ser. No. 10/051, 671, a superconducting current limiting device is disclosed comprising a trigger matrix and a current limiting matrix. The trigger matrix comprises a plurality of superconductors surrounded by a normal conducting coil wherein the coil and the superconductor are electrically connected in parallel. The current limiting matrix comprises a plurality of superconductors surrounded by a normally conducting coil wherein the coil and the superconductor are only connected physically but not electrically in parallel. Each trigger element of the trigger matrix is electrically connected in series with the coil of a plurality of current limiting elements of the current limiting matrix. In case of fault the superconductor of the trigger element forces current into its own coil and, at the same time, into the coils of the current limiting elements. The magnetic field generated by the current flowing through the coils assists the quenching of the respective superconductors.

However, since the current supplied from the trigger coil is shared between multiple other coils the field generated is only low and only insufficient for driving the superconductors into the normal conducting state, in particular within the desired short time period.

Moreover, the function of this device depends on the faultless working of the trigger elements. If there is any fault in the trigger elements no uniform quenching of the current limiting elements connected to this trigger element is ensured which could result in local heating or burn out due to hot spots.

It was the object of the present invention to provide an inductive superconducting current limiting device with improved capability of producing a high magnetic field within a very short time for uniform and rapid quenching.

A further object of the present invention is to provide a superconducting current limiting device which is self triggering, that is, which detects and limits fault current without active or external control.

These objects are solved by a superconducting current limiting device comprising at least one superconductor component wherein each superconductor component comprises at least one superconductor body and a coil wound on the at least one superconductor body, wherein the coil is electrically connected in parallel to the at least one superconductor body and wherein the superconductor body has a cross sectional surface area with an external shape allowing a circular screening current to flow and the coil is in tight contact with the external surface of the at least one superconductor body.

The superconducting current limiting device of the present invention is self triggering, which means, that there is no external control of the detection of fault and build up of the magnetic field for quenching required.

According to the present invention each superconductor body or each group of superconductor bodies is provided with a separate coil. In case of fault a sufficiently high magnetic field can be generated bringing the superconductor to its normal conducting state in a very short time and with high uniformity. Further, since each superconductor body or each group of superconductor bodies has a separate coil it works independently and generates its own field.

Rapid build up of a magnetic field by the coil and, thus, rapid quenching require that the excess current starts to flow within the coil without delay when the fault event occurs. That is, current flow within the coil and voltage build up within the superconductor body due to the fault event should be as simultaneously as possible.

However, due to the inductivity inherent to the coil which acts against the current flow there is a delay between the flow of a sufficiently high current within the coil and the voltage build up within the superconductor body.

According to the present invention this inductivity of the coil is minimized by winding the coil as tightly as possible around the superconductor body and, simultaneously, by using a superconductor body which has a cross sectional surface area with an external shape which allows a circular screening current to flow.

By the circular screening current the internal of the superconductor body can be kept free of a magnetic field which, in turn, is required for low or non inductivity of the coil.

In principle the superconductor body of the present invention can be made of any superconductor material.

Preferred are high temperature superconductor materials such as the well known YBCO-type superconductors, BSCCO(2223, 2212)-type superconductors and $MgB_2$-tpye superconductors.

The superconductor material can include one or more suitable additional and/or substitute element. For example, in BSCCO part of the bismuth can be substituted by Pb, i.e. [(Pb—)Bi—Sr—Ca—CuO].

The superconductor body can be a bulk or tape. It can be a hollow body or a solid body.

According the present invention the superconductor body has a shape resulting in non or only low inductivity.

As set out above, "shape of non or only low inductivity" means a shape which allows the flow or generation of circular screening currents. For a circular flow of the current it is necessary that the external surface of the superconductor body has a continuous perimeter, that is, a perimeter without interruption. Therefore, the superconductor body of the present invention has ideally a cross sectional surface with a round geometry. That is, preferably, the superconductor body of the present invention has a cylindrical shape such as a tube, a rod, a bifilar spiral or a bifilar coil.

By the present invention also cross sectional geometries are included deviating from the ideal round or oval geometry provided, that the objectives of the invention are met, that is, that the internal of the coil can be kept essentially field free so that a sufficiently low inductivity can be achieved. For example, also polygonal cross sectional geometries are possible, such as square, or rectangular, pentangal or hexagonal cross sectional geometries. A typical example of a suitable articles with such a cross sectional geometry is a bar.

The shunt coil can be made of a normal conducting metal as well as of a superconductor material.

Suitable metals are copper, copper alloys, steel, etc.

Examples for superconducting materials are tapes, e.g. made of BSCCO-type material or YBCO thin films, (optionally with one or more additional and/or substitute element) as set out above for the superconductor body.

In case of a shunt coil of superconductor material a sufficiently high contact resistance or similar means should be provided in order to avoid premature current flow in the coil.

If the coil is made of a superconductor material the magnetic field generated is very-high already at low voltages. This accelerates the generation of the magnetic field. Further, it is assumed that by a coil made of superconductor material the first peak of the current can be minimized.

According to the present invention the coil is in tight contact with the superconductor body. That is, the space between superconductor body and coil should be as small as possible in order to keep the residual inductivity of the coil as small as possible. To this, the coil shall be wound very closely and preferably, homogeneously onto the superconductor body to reduce the space between superconductor and coil. That is, compared to the diameter of the cross sectional area of the coil the space between coil and surface of superconducting body should be as small as possible. For example, if the diameter of the superconducting body is about 2 cm the space should not exceed 1 mm. Preferably the coil is in direct contact with the surface of the superconducting body. In this case an insulating layer can be applied between superconducting body and coil.

By making the space as small as possible the inductivity of the coil is strongly reduced because the circular screening currents induced in the superconductor body shield the coil volume and there is no or substantially no field within the coil. Current flow in the coil starts immediately upon voltage generation in the superconductor body, and the magnetic field can build up very rapidly, so that the superconductor material is brought into its normal conducting state very rapidly and homogeneously.

There are four reasons why the superconductor body of the present invention is brought into the normal state:

1. The short circuit current exceeds the critical current. In the fault case, i.e. where the critical current is exceeded, the superconductor builds up resistivity and corresponding voltage (flux flow) that causes that a part of the current flows in the parallel connected coil without any external control.

2. The power development in the limitation case causes a temperature increase and therefore reduces the critical current density.

3. The magnetic field build up by the coil reduces the critical current density of the superconductor material.

This behaviour is large in the range of small voltage criteria, at higher current densities such as 5 to 10 times the critical current, and therefore higher voltage criteria the reduction of the current density due to the field is lower.

4a) Most important and in addition to the above cited effects the superconducting current limiting device of the present invention has a design by which current flow starts within the coil without delay so that immediately upon fault event an additional circulating screening current is induced in the superconductor body caused by the magnetic field of the coil. Due to this additional current the heating up and, thus, quenching of the material is accelerated since the fault current and the circulating screening current sum up according to their vector character.

4b) A further point suppressing the hot spots formation is that the induced circular screening current is higher in the superconducting regions than in the regions where normal conducting hot spots arise. This enhances the heating of the superconductor body and contributes to a homogeneous temperature of the superconductor body.

4c) In the superconducting current limiting device of the present invention the magnetic field is built up within a very short time since the inductivity of the coil is strongly reduced.

For the present invention a current fault event can be preferably defined to be generated when the critical current is exceeded at least by the threefold. This limit, however, depends on the actual application.

According to the present invention, preferably, a sufficient magnetic field driving the superconductor homogeneously in the resistive state can be in the range from about 0.05, preferably from about 0.1, to 1 Tesla. A magnetic field of approximately 0.2 Tesla has proven to be sufficient in the significant quenching stage.

The electric resistance within the coil and, thus, the current in the coil and the resulting magnetic field are determined by the cross section of the coil and the number of turns or windings of the coil. On the other hand, the magnetic field determines the induced circular current and therefore enhances the quench.

The magnetic field generated by a coil can be calculated by the following equitation:

$$B = \mu_0 H = \frac{\mu_0 \upsilon I \upsilon N}{L}$$

with B=magnetic induction; $\mu_0$=magnetic field constant; H=magnetic field-strength; I=current; L=length of coil and N=number of turns.

For example, at a turn ratio of 25:1 due to the transformer principle, 1000 A in the coil induces a circular screening current of 25,000 A in the superconductor body. This is a theoretical value, the actual current will be somewhat smaller. However, this clearly illustrates the huge amount of induced current in this process.

For practical application usually the coil should have at least one winding or turn per 2 cm of length of superconductor body and the number of turns should not exceed 10 per 1 cm length of superconductor body.

In particular, if the coil is made of a superconductor material the number of turns can exceed 10 turns per 1 cm length of the superconductor body.

Further, it is also possible, to apply the coil on the superconductor body in two or more layers. The number of layers is not particularly restricted and can be selected according to need.

Also the inductivity of the coil is proportional to the number of windings as well as of the average cross sectional area A of the coil. However, since according to the present invention the coil is tightly wound on the superconductor surface and the space between the coil and the external surface of the superconductor body is as small as possible the average cross sectional area A of the coil is minimized, which means that even with a rather high number of turns the inductivity of the coil can be kept extremely low.

Usually, the cross section of the coil made of a normally conducting metal is within a range of from 1 to 10 mm$^2$. If the coil is made of a superconducting material the cross section can be up to a factor 100 smaller. It is clear, that the cross section may vary depending on specific material for the coil and the superconductor as well as on specific application demands.

The coil can be fixed to the superconductor body at the electrical contacts, e.g. metal contacts, e.g. of copper, provided at each end of the superconductor body for current supply. The method for fixing is not particularly restricted. Any suitable method can be used, for instance soldering.

If the region of overlap of the coil with the electrical contacts is to large circulating currents could be induced in the electrical contacts which should be avoided. Generally it can be said, that the coil should be wound around the electrical contacts on a lengths of not more than 5 mm. However, it is clear, that the allowable extension of overlap depends on the specific design of the superconductor component.

The number of superconductor components present in the superconducting current limiting device of the present invention can be chosen according to need and is not particularly restricted. For example there can be 50 and more and up to several thousands, e.g. 3000 and more, of such components.

The superconducting components can be connected to each other in series and/or in parallel. There is no particular restriction.

According to an advantageous embodiment of the present invention the superconductor component can comprise more than one superconductor body surrounded by a common coil. In this embodiment the superconductor bodies are connected to each other in series and the coil is connected in parallel by electrically connecting the coil with the incoming end of the first superconductor body and the out-going end of the last superconductor body. By this specific design using a common coil for a plurality of superconductor bodies a uniform quench behaviour can be achieved for all superconductor bodies. If voltage is caused by a bad area, for instance hot spot area, in one of the superconductor bodies the magnetic field generated does not only include the specific superconductor body but all superconductor bodies are included by the uniform magnetic field generated.

For illustration purposes a suitable number of superconductor bodies can be 10.

As the material for the superconductor body particularly preferred are superconductor bodies produced by a melt cast process, in particular a centrifugal casting method as disclosed, for example, in BE-A-3 830 092, EP-A-0 451 532, EP-A-0 462 409 and EP-A-0 477 493, to which reference is expressly made.

For example, in EP-A-0 462 409 a process for the production of tubular superconductor bodies is disclosed, wherein an oxide starting mixture is allowed to run in predetermined stoichiometry at temperatures from 900 to 1100° C. into a casting zone rotating about its horizontal axis. The solidified shaped body is taken out of the casting zone and heat treated for 4 to 150 hours at 700 to 900° C. in an oxygen containing atmosphere. This process is particularly suitable for BSCCO-based superconductor bodies.

The inductive superconducting current limiter of the present invention is particularly useful for AC applications.

In the following the present invention is further illustrated with reference to the figures showing preferred embodiments of the invention, without being limited thereto.

FIG. 1 shows one embodiment of a superconductor component of the present superconductor current limiting device 5 showing the principles, FIGS. 2a and b show different embodiments for the superconductor body of the superconductor element of the present invention, FIGS. 3a and b show a further embodiment for the superconductor body of the superconductor element of the present invention, FIG. 4 shows yet another embodiment of the superconductor body of the superconductor element of the present invention, and FIG. 5 shows a diagram illustrating a limiting event.

In FIG. 1 a preferred embodiment of the superconductor component 1 used in the present invention is shown having the form of a tube or rod. On the superconductor body 2 a coil 3 is wound which is fixed to the electrical contacts 4, 5 at the opposite ends of the superconductor body 2. The electrical contacts 4, 5 are provided with means 7, such as threads, in order to allow the fixing onto current leads for current supply and connecters to annexed elements.

In this embodiment a hole 6 is provided in each electrical contact 4, 5 for allowing cooling medium such as liquid nitrogen, to flow also in the inner area of the superconductor body 2, too. Thereby the recooling process can be accelerated.

A superconductor body having the form of a tube or a rod can have a length between of from 15 mm to about 500 mm. In practise the length is selected according to need of the specific superconducting current limiting device.

Usually, the diameter in case of rods is between form about 5 to about 30 mm and the diameter in case of a tube is between of from about 15 to about 100 mm. As is the case with the length also the diameter can be selected according to need.

The actual dimension of the superconductor body depends on the amount of superconductor material necessary.

For example BSCCO-2212-type material obtained by melt casting process, which is preferred, can be used for electrical fields higher than 0 to 10 Vrms/cm or higher, particularly between 1 to 10 Vrms/cm or higher. At such a high electrical field less material is required which results in lower AC losses. The maximum electrical field depends also on the limitation time required for each application.

In case of a hollow body such as a tube the wall thickness should be small in order to get a short recovery time. For example, the wall thickness can be down to 1 mm. In order to enhance the mechanical stability such superconductor hollow bodies having a small wall thickness can be provided with a mechanical reinforcement. The reinforcement material should have the same or at least approximately the same thermal expansion as the superconductor material to avoid crack formation during cool down or during heating up. Suitable reinforcement materials are well known to the skilled persons. Examples are fibre reinforced plastics (FRP).

The reinforcement materials used for such superconductor bodies are invisible for the magnetic field and does not shield the superconductor body from the magnetic field. The reinforcement material can be applied externally and/or internally.

In the embodiment according to FIGS. 2 and 3 the reinforcement material 8, 9 is applied internally.

Preferably, the reinforcement material is perforated to obtain a higher surface area for the cooling medium for a faster recovery time.

For example as shown in FIG. 2a the reinforcement material 8 can be applied internally in form of stripes.

However the reinforcement material 8 can be also a continuous body, such as a continuous tube as shown in FIG. 2b, which can be permeable for the cooling medium, by applying perforation or similar means.

In the following the general principles of the configuration of the present superconducting current limiting device is illustrated in more details with reference to a preferred embodiment with a tubular superconductor body.

These principles and modifications explained below are likewise applicable to superconductor components of different shape and dimensions.

FIG. 1 shows an example of a superconductor component 1 having a superconductor body 2 in form of a tube made of BSCCO-2212, preferably obtained by melt casting process.

The outer diameter is 24 mm and the wall thickness 1 mm resulting in a superconducting cross section of 72 mm$^2$. Both ends of the tube 2 are provided with a metal contact 4, 5 made of copper. A coil 3 made of copper is wound around the superconductor body 2 wherein for a tube of 10 cm length the coil has approximately 25 turns and a conductor cross section of 2 mm$^2$.

At a operating temperature of 77 K the critical current at this cross section is 1080 A (critical current density 1500 A/cm$^2$). Considering the peak current and a safety factor 1.2, the rated current [root means square (rms) current] is 1,080 A/(1.414×1.2)636 A. At an operating temperature of 65 K the rated current is approximately 2,000 A.

According to a preferred embodiment the reinforcement material 8 is a tube 9 which is introduced into the hollow interior of a superconductor body 2 which itself is a tube as shown in FIG. 3. Over the length of the superconductor body 2, the external diameter of the reinforcement tube 9 is less than the internal diameter of the hollow interior of the superconductor body 2. Further, over the length of the superconductor body 2 means such as holes or slots are provided in the wall of the reinforcement tube 9 allowing the flowing cooling medium to penetrate into the gap between the external surface of the reinforcement tube and the internal surface of the hollow interior of the superconductor body 2. For example, if the inner diameter of the superconductor body is approximately 20 mm the outer diameter of the reinforcement tube 9 can be about 10 mm.

Over the length of the superconductor body 2 in this embodiment there is no physical contact between the internal surface of the hollow interior of the superconductor body 2 and the tube 9 of the reinforcement material 8.

Fixation of the tube 9 of the reinforcement material to the superconductor component occurs in the region of the electrical contacts 4 and 5. Here the outer diameter of the tube 9 of reinforcement material and the inner diameter of the hollow interior in the region of the contacts 4, 5 can be adjusted to each other, so that there is physical contact between the surfaces. Fixation can be carried out by suitable fixing means such as screws or adhesives.

According to a modification it is also possible to insert the superconductor body 2 into the reinforcement tube 9.

Dependent on the production process the outer and/or inner surface of the obtained superconductor body e.g., superconductor tube, can show inhomogenities such as cracks, fractures, lunker, etc. Further the obtained body can have region of different microstructures across its cross section. In this case the respective surface can be removed to an extent until a region in which the obtained superconductor material has optimal performance.

For example, in the specific embodiment set out above it can be advantageous to remove the outer surface to an extent of about 0.8 mm where a region begins having best performance.

The removal of faulty superconductor material can be carried out by any suitable means such as machining off etc.

For providing good connection and adherence of the electrical contacts 4, 5 to the material of the superconductor body the ends of the superconductor body to which the electrical contacts 4, 5 shall be applied are provided with contact resistance 10 as shown in FIG. 4. For example in the specific embodiment referred to above on both ends of the BSCCO tube obtained after the melt-cast process liquid silver can be applied by spraying. Then, in the burn-in process during the annealing procedure of the superconductor material the silver melts and mixes with the BSCCO material to a low resistance material to which the contacts can be applied easily by soldering. For the present BSCCO tube copper contacts are used which can be preferably soldered by an InBi66/33 solder.

Of course any other metal of high conductivity can be used for the contact resistance 10 such as copper, gold, palladium, platinum, rhodium, iridium, ruthenium, osmium and alloys thereof with silver and silver alloys being preferred.

After the annealing process and the appliance of the contact resistance 10 the length of the superconductor body 2 between both ends with the contact resistance are reduced in diameter in order to remove faulty material, if necessary, thereby obtaining a superconductor body 2 as shown in FIG. 4 having regions of contact resistance 10 at both ends. The diameter of the transition area between the region of contact resistance 10 and the reduced superconductor body 2 can increase continuously towards the contact resistance in order to obtain a smooth transition.

The working temperature of a superconductor component of the type illustrated above preferably is between 65 K to 85 K. Between this temperature range the critical current density rises by a factor of 10. Further, low temperatures such as 65 K are advantageous in order to decrease the first peak of the limiting event.

In FIG. 5 a limiting event is shown for a superconductor component composed of a melt cast processed BSCCO-2212 superconductor tube having an outer diameter of 23 mm. The critical current here is 1,200 A. The operating temperature is 77 K. At 10 times the rated current the peak current is up to 7 kA (7 times the rated current) and the limited current is up to 3 kA, the limiting time is 100 ms and an electrical field of 5 Vrms/cm.

In the following the principles of the configuration such as coil and tube parameters, of the superconductor component used in the present invention is further illustrated with reference to a specific example wherein the coil is made of a superconductor material.

The superconductor component has a superconductor body having the shape of a tube made of BSCCO-2212 obtained by melt casting process is used.

The outer diameter is 24 mm and the wall thickness 1 mm resulting in a superconducting cross section of 72 mm$^2$. At an operating temperature of 77 K the critical current of this BSCCO tube is 1080 A (critical current density 1500 A/cm$^2$). Considering the peak current and a safety factor 1.2, the rated current [root means square (rms) current] is 1,080 A/(1.414×1.2)=636 A.

Both ends of the tube are provided with a metal contact made of copper as shown in FIG. 1. A coil made of BSCCO 2223 superconducting tape (PIT, Matrix Ag, conductor dimensions of 0.2 mm thickness and 5 mm width) is wound around the superconductor body. For a tube of 30 cm length the coil has approximately 600 turns with 10 layers. This results in a conductor length of 46 m.

Therefore, at only 4.6 mV the coil would reach its critical current (e.g. 100 A). This corresponds to a magnetic field of 0.25 T, sufficient for a safe quench of the superconducting body.

In this embodiment the number of turns is 20 per 1 cm length of superconductor body.

A further advantage of a superconducting coil is that the first current peak is strongly decreased, because already a very low voltage results in high currents in the coil.

| List of reference numbers | |
|---|---|
| 1 | superconductor component |
| 2 | superconductor body |
| 3 | coil |
| 4 | electrical contact |
| 5 | electrical contact |
| 6 | hollow interior |
| 7 | fixing means |
| 8 | reinforcement material |
| 9 | reinforcement tube |
| 10 | contact resistance |

The invention claimed is:

1. Superconducting current limiting device comprising: at least one superconductor component, wherein each superconductor component has at least one superconductor body and a coil wound on said at least one superconductor body, wherein said coil is electrically connected in parallel to said at least one superconductor body; and wherein said at least one superconductor body has a cross sectional surface area with an external shape allowing a circular current to flow, wherein a superconducting material of said superconductor body extends over an entire perimeter of the cross sectional area of the superconductor body, and wherein said coil is in tight contact with said external surface of said at least one superconductor body for reducing inductivity of the coil.

2. Superconducting current limiting device according to claim 1, wherein said cross sectional surface area of said superconductor body has either a round or oval geometry.

3. Superconducting current limiting device according to claim 1, wherein said superconductor body has a shape selected from any one of a tube, a rod, a bar and bifilar coil.

4. Superconducting current limiting device according to claim 1, wherein said superconductor material selected from any one of YBCO-type, MgB$_2$-type and BSCCO-type.

5. Superconducting current limiting device according to claim 4, wherein said superconductor material includes one or more additional or substitute elements.

6. Superconducting current limiting device according to claim 1, wherein said superconductor body is made of a melt cast processed material.

7. Superconducting current limiting device according to claim 6, wherein said superconductor body is of a BSCCO-type material.

8. Superconducting current limiting device according to claim 1, wherein said coil is made of a material selected from a metal or a superconducting material.

9. Superconducting current limiting device according to claim 1, wherein said coil is wound on said superconductor body with at least one winding per 2 cm length of superconductor body and with a maximum of 10 windings per 1 cm length of superconductor body.

10. Superconducting current limiting device according to claim 1, wherein an outer surface of said superconductor body is removed.

11. Superconducting current limiting device according to claim 1, wherein said, superconductor body is provided with a reinforcement material.

12. Superconducting current limiting device according to claim 11, wherein said reinforcement material is perforated.

13. Superconducting current limiting device according to claim 11, wherein a reinforcement material having the shape of a tube and said superconductor body having the shape of a tube, are introduced into each other, wherein both tubes have different diameters forming a gap between both tubes.

14. Superconducting current limiting device according to claim 1, wherein the working temperature of said superconductor body is between 85 to 65 K.

15. Superconducting current limiting device according to claim 1, wherein said at least one superconductor component further comprises two or more superconductor bodies connected in series which are connected in parallel with one coil including all superconductor bodies.

16. Superconducting current limiting device according to claim 1, wherein in said superconductor current limiting device, said superconductor components are connected to each other in either series or in parallel.

17. Use of a superconducting limiting device in accordance with claim 1 for AC applications.

* * * * *